US012805272B2

(12) United States Patent
Oh et al.

(10) Patent No.: US 12,805,272 B2
(45) Date of Patent: Nov. 17, 2026

(54) METHODS TO IMPROVE ETCH SELECTIVITY AND CRITICAL DIMENSION UNIFORMITY WHEN ETCHING HIGH ASPECT RATIO FEATURES WITHIN A HARD MASK LAYER

(71) Applicant: Tokyo Electron Limited, Tokyo (JP)

(72) Inventors: Minseok Oh, Albany, NY (US); Ayuta Suzuki, Albany, NY (US); Joshua Baillargeon, Albany, NY (US); Michael Ramsey, Albany, NY (US); Minjoon Park, Albany, NY (US); Jeffrey Shearer, Albany, NY (US); Hojin Kim, Albany, NY (US); Tek Po Rinus Lee, Albany, NY (US); Toru Hisamatsu, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 272 days.

(21) Appl. No.: 18/818,806

(22) Filed: Aug. 29, 2024

(65) Prior Publication Data

US 2026/0068612 A1 Mar. 5, 2026

(51) Int. Cl.
*H10P 76/40* (2026.01)
*H10B 12/00* (2023.01)
(Continued)

(52) U.S. Cl.
CPC ....... *H10P 76/405* (2026.01); *H10B 12/0387* (2023.02); *H10B 41/20* (2023.02);
(Continued)

(58) Field of Classification Search
CPC ... H10P 76/405; H10P 50/73; H10B 12/0387; H10B 41/20; H10W 20/056; H10W 20/089
See application file for complete search history.

(56) References Cited

U.S. PATENT DOCUMENTS 5,776,808 A 7/1998 Muller et al.
6,190,955 B1 2/2001 Ilg et al.
(Continued)

FOREIGN PATENT DOCUMENTS

JP H0738389 B2 * 4/1995

OTHER PUBLICATIONS

JP 07-38389 B2, Method for Manufacturing Semiconductor Device, English machine translation, published Apr. 26, 1995. (Year: 1995).*
(Continued)

*Primary Examiner* — Anita K Alanko
(74) *Attorney, Agent, or Firm* — Egan, Enders & Huston LLP.

(57) ABSTRACT

Various embodiments of stacked structures, process steps and methods are provided herein for etching high aspect ratio features (e.g., features having an aspect ratio ≥30:1) within stacked structures to reduce or eliminate problems that occur during conventional HAR etch processes. More specifically, novel hard mask layers and methods are provided to improve the etch profile, post-etch surface roughness and CD uniformity of high aspect ratio features etched within hard mask layers, as well as the etch selectivity to layer(s) underlying the hard mask layers or other semiconductor materials exposed on the substrate surface.

23 Claims, 8 Drawing Sheets

(51) Int. Cl.
*H10B 41/20* (2023.01)
*H10P 50/00* (2026.01)
*H10W 20/00* (2026.01)

(52) U.S. Cl.
CPC ........... *H10P 50/73* (2026.01); *H10W 20/056* (2026.01); *H10W 20/089* (2026.01)

(56) References Cited

U.S. PATENT DOCUMENTS

| | | | | |
|---|---|---|---|---|
| 6,458,284 | B1 * | 10/2002 | Kashihara | H10P 50/267 216/41 |
| 9,659,783 | B2 | 5/2017 | Guha et al. | |
| 10,347,488 | B2 * | 7/2019 | Cheng | H10P 14/6302 |
| 11,276,573 | B2 | 3/2022 | Qi et al. | |
| 2019/0064649 | A1 * | 2/2019 | Kominato | G03F 1/26 |
| 2023/0081817 | A1 | 3/2023 | Belau et al. | |
| 2023/0343593 | A1 * | 10/2023 | Nagabhirava | C23C 16/4486 |
| 2023/0343598 | A1 | 10/2023 | Chang et al. | |
| 2023/0360925 | A1 * | 11/2023 | Lin | H10P 50/268 |
| 2023/0395391 | A1 | 12/2023 | Wang et al. | |
| 2023/0397416 | A1 | 12/2023 | Dorfner et al. | |
| 2024/0038833 | A1 | 2/2024 | Fishburn et al. | |
| 2025/0379053 | A1 * | 12/2025 | Baillargeon | H10P 76/4085 |
| 2025/0379054 | A1 * | 12/2025 | Baillargeon | H10P 50/71 |

OTHER PUBLICATIONS

Ishikawa et al., "Progress in Nanoscale Dry Processes for Fabrication of High-Aspect-Ratio Features: How Can We Control Critical Dimension Uniformity at the Bottom?"; Japanese Journal of Applied Physics; Section 57, 2018, 19 gs.

Kumakura et al., "Novel Technology of High-Aspect-Ratio Etch Utilizing Coverage-Controllable Atomic Layer Deposition", Japanese Journal of Applied Physics, Section 61, 2022, 10 pgs.

* cited by examiner

METHODS TO IMPROVE ETCH SELECTIVITY AND CRITICAL DIMENSION UNIFORMITY WHEN ETCHING HIGH ASPECT RATIO FEATURES WITHIN A HARD MASK LAYER

BACKGROUND

The present disclosure relates to the processing of substrates. In particular, it provides methods for improving etch selectivity and critical dimension (CD) uniformity during a high aspect ratio (HAR) etching process.

Semiconductor device formation typically involves a series of manufacturing techniques related to the formation, patterning, and removal of layers of material on a substrate. To meet the physical and electrical specifications of current and next generation semiconductor devices, process flows are being requested to reduce feature size while maintaining structure integrity for various patterning processes.

Semiconductor device formation has progressed from two-dimensional (2D) to three-dimensional (3D) layouts to increase the number of transistors, capacitors and other semiconductor devices per unit area. In 3D process flows, high aspect ratio (HAR) etch processes are used to form HAR features (such as holes, vias, trenches, etc.) within a variety of semiconductor materials and layers. For example, in a 3D NAND memory array, a HAR etch process is performed to form deep holes (or "channels") within a vertical stack of alternating dielectric and conductive layers (e.g., alternating layers of oxide and nitride (ONON), alternating layers of silicon oxide and polysilicon (OPOP), etc.). The deep holes are subsequently filled with a conductive material to enable individual memory cells of the 3D-NAND memory to connect with one another in the vertical stack. In dynamic random access memory (DRAM) devices, deep holes are etched into a capacitor mold oxide and subsequently lined with a conductive material and filled with a dielectric material to form DRAM capacitors. As another example, through silicon vias (TSV) for stacking integrated circuit chips are fabricated by etching HAR holes completely through semiconductor substrates.

Plasma etching is typically used to form HAR features within 3D-NAND and DRAM memory devices. Before the HAR features are etched, a hard mask layer is deposited onto a dielectric material (or a vertical stack of alternating dielectric and conductive layers) and a number of overlying layers, such as a photoresist (PR) layer, an antireflective coating (ARC) layer, etc., are formed on top of the hard mask layer. After the overlying layers are formed, the PR layer is patterned using lithography techniques to create a pattern of the features (e.g., contact holes, vias, trenches, etc.) to be etched within the layers underlying the PR layer.

A number of etch processes may be utilized to etch the pattern of features within the layers underlying the PR layer. For example, a first etch process may be performed to etch the pattern of features within the hard mask layer in a "Mask Open" step, and a second etch process may be subsequently performed to extend the pattern of holes through the dielectric material (or vertical stack) in a "Dielectric Etch" step. Like the Dielectric Etch step, the Mask Open step is typically a HAR etch process.

Hard masks used to etch HAR features within dielectric layers and other semiconductor materials need to be relatively thick to permit only vertically directed atoms and ions from the etching gases to impinge upon the surface of the substrate. While metal hard masks composed of tungsten (W), titanium-tungsten (TiW) or titanium nitride (TIN) provide adequate selectivity, stress from thick metal layers is excessive. Hard masks fabricated from relatively thick low-stress materials (such as, e.g., amorphous carbon and amorphous silicon) provide acceptable stress, but low selectivity when etching deep trenches and holes. Due to the lower selectivity, very thick layers (e.g., 1-4 μm) of amorphous materials are often used as a hard mask, which may still not be sufficient to protect the underlying materials. In addition to selectivity concerns, increasing the thickness of the hard mask layer increases the aspect ratio of the features etched within the hard mask layer, which makes plasma etching even more challenging. For example, bowing, twisting and critical dimension (CD) non-uniformity for contacts and vias, and wiggling for trenches, are key challenges encountered when etching HAR features within dielectric.

Accordingly, new hard mask materials and methods are needed to overcome the challenges involved in HAR etch processes.

SUMMARY

The present disclosure provides various embodiments of stacked structures, process steps and methods for etching high aspect ratio (HAR) features (e.g., features having an aspect ratio ≥30:1) within stacked structures to reduce or eliminate problems that occur during conventional HAR etch processes. More specifically, the present disclosure provides novel hard mask layers and methods to improve etch selectivity and critical dimension (CD) uniformity when etching HAR features within hard mask layers.

A stacked structure in accordance with the present disclosure includes a hard mask (HM) stack, which is formed above and in contact with one or more underlying layers formed on a semiconductor substrate. The HM stack includes a hard mask layer containing a metal silicide nitride material. Unlike conventional hard mask layers, which have substantially uniform material composition, the material composition of the metal silicide nitride material varies across the thickness of the hard mask layer, resulting in a "graduated hard mask layer." In some embodiments, the graduated hard mask layer may contain a tungsten silicide nitride ($W_xSi_yN_z$) material, and the amount of tungsten (W), silicon (Si) and nitrogen (N) (e.g., the atomic percentage of W, Si and N) included within the graduated hard mask layer may change gradually between the top and the bottom of the graduated hard mask layer. When the stacked structure is subsequently etched to form HAR features (e.g., holes, vias, trenches, etc.) within the graduated hard mask layer, the different amounts of Si and N included within the graduated hard mask layer improve the etch profile, post-etch surface roughness and CD uniformity of the HAR features, as well as the etch selectivity to the underlying layer(s) formed on the semiconductor substrate or other semiconductor materials exposed on the substrate surface.

According to one embodiment, a method is provided that utilizes the techniques described herein to etch high aspect ratio (HAR) features within a hard mask layer. In some embodiments, the method may begin by forming a graduated hard mask layer containing a metal silicide nitride material above and in contact with one or more underlying layers formed on a semiconductor substrate. The amount of silicon (Si) and an amount of nitrogen (N) included within the metal silicide nitride material varies across a thickness of the graduated hard mask layer. More specifically, the atomic percentage of silicon (Si at. %) and the atomic percentage of nitrogen (N at. %) included within the metal silicide nitride material varies across the thickness of the graduated hard mask layer and changes gradually between a top and a bottom of the graduated hard mask layer. The method may further include performing a first etch process to etch the HAR features through the graduated hard mask layer. Compared to conventional hard masks, the graduated hard mask layer used in the method disclosed herein improves an etch profile, a post-etch surface roughness and a critical dimension (CD) uniformity of the HAR features etched through the graduated hard mask layer, as well an etch selectivity to the one or more underlying layers, during the first etch process.

In some embodiments, the atomic percentage of the silicon may be smaller than the atomic percentage of the nitrogen near the top of the graduated hard mask layer to improve the post-etch surface roughness and the CD uniformity of the HAR features etched during the first etch process. In such embodiments, the atomic percentage of the silicon may be larger than the atomic percentage of the nitrogen near the bottom of the graduated hard mask layer to improve the etch profile of the HAR features and the etch selectivity to the one or more underlying layers during the first etch process.

In other embodiments, the atomic percentage of the silicon may be larger than the atomic percentage of the nitrogen near the top of the graduated hard mask layer to improve an etch selectivity to other materials exposed on a surface of the semiconductor substrate. In such embodiments, the atomic percentage of the silicon may be smaller than the atomic percentage of the nitrogen near the bottom of the graduated hard mask layer to improve the post-etch surface roughness and the CD uniformity of the HAR features etched during the first etch process.

A wide variety of deposition processes can be used to form the graduated hard mask layer in the method disclosed herein. In one embodiment, the graduated hard mask layer may be formed by depositing the metal silicide nitride material on the one or more underlying layers using a physical vapor deposition (PVD) process, and adjusting one or more process parameters during the PVD process to vary the amount of silicon and the amount of nitrogen included within the metal silicide nitride material as the metal silicide nitride material is deposited. In some embodiments, the one or more process parameters may be adjusted by continually or periodically adjusting one or more of a plasma power and a nitrogen ($N_2$) gas flow rate during the PVD process.

The graduated hard mask layer disclosed herein may include a wide variety of metal silicide nitride materials. For example, the graduated hard mask layer may be selected from a group consisting of a tungsten silicide nitride ($W_xSi_yN_z$) material, a titanium silicide nitride ($Ti_xSi_yN_z$) material, a cobalt silicide nitride ($Co_xSi_yN_z$) material, a nickel silicide nitride ($Ni_xSi_yN_z$) material, an aluminum silicide nitride ($Al_xSi_yN_z$) material, a molybdenum silicide nitride ($Mo_xSi_yN_z$) material, a tantalum silicide nitride ($Ta_xSi_yN_z$) material and a platinum silicide nitride ($Pt_xSi_yN_z$) material. In one embodiment, the metal silicide nitride material may be tungsten silicide nitride ($W_xSi_yN_z$).

In the method disclosed above, a graduated hard mask layer is utilized to improve the etch profile, post-etch surface roughness and CD uniformity of HAR features etched within the hard mask layer, as well as the etch selectivity to the one or more underlying layers formed beneath the hard mask layer. The HAR features etched within the graduated hard mask layer may include a wide variety of features, including holes, vias, trenches, etc., having aspect ratios greater than or equal to 30:1. In some embodiments, the thickness of the graduated hard mask layer may range between approximately 300 nm and 1000 nm, and the HAR features etched through the graduated hard mask layer may have an aspect ratio ranging between 30:1 and 100:1.

According to another embodiment, a method is provided that utilizes the techniques described herein to etch a pattern of holes within a stacked structure included within a semiconductor memory device. In some embodiments, the method may begin by forming the stacked structure on a semiconductor substrate, wherein said forming the stacked structure comprises: (a) forming one or more underlying layers on the semiconductor substrate, and (b) forming a hard mask (HM) stack above and in contact with the one or more underlying layers.

The HM stack may generally comprise a graduated hard mask layer containing a metal silicide nitride material. Like the previous embodiment, the graduated hard mask layer included within the HM stack may be formed by varying an amount of silicon (Si) and an amount of nitrogen (N) included within the metal silicide nitride material across a thickness of the graduated hard mask layer. In some embodiments, the graduated hard mask layer may contain a tungsten silicide nitride ($W_xSi_yN_z$) material, and the atomic percentage of the silicon (Si at. %) and the atomic percentage of the nitrogen (N at. %) included within the tungsten silicide nitride ($W_xSi_yN_z$) material may change gradually between a top and a bottom of the graduated hard mask layer. In some embodiments, the atomic percentage of Si may be smaller than the atomic percentage of N near the top of the graduated hard mask layer to improve the post-etch surface roughness and the CD uniformity of the pattern of holes etched during the first etch process. In such embodiments, the amount of Si and N included within the graduated hard mask layer may gradually transition into a larger atomic percentage of Si and a smaller atomic percentage of N near the bottom of the graduated hard mask layer to improve the etch profile of the pattern of holes and the etch selectivity to the one or more underlying layers during the first etch process.

In some embodiments, the HM stack may include one or more additional hard mask layers. For example, the HM stack may include a silicon-containing hard mask layer formed above and in contact with the graduated hard mask layer, and a carbon-containing hard mask layer formed above and in contact with the silicon-containing hard mask layer. In one example embodiment, the silicon-containing hard mask layer may comprise a silicon dioxide ($SiO_2$) hard mask layer and the carbon-containing hard mask layer may comprise an amorphous carbon layer (ACL) hard mask layer. When additional hard mask layers are included within the HM stack, the thickness of the HM stack may range between approximately 1 μm and 3.5 μm. In one example embodiment, the thickness of the HM stack may range between 0.85 μm and 3.0 μm.

The method may further include performing a first etch process to etch the pattern of holes through the HM stack and performing one or more additional etch processes to etch the pattern of holes through the one or more underlying layers using the HM stack as a hard mask. Due to the thickness of the HM stack and the relatively small diameter of the pattern of holes etched through the HM stack, the pattern of holes etched through the HM stack may have an aspect ratio greater than or equal to 30:1 (e.g., 30:1 to 40:1). Compared to conventional HAR etch processes used to etch deep holes within relatively thick hard mask layers, the method disclosed herein improves an etch profile, a post-etch surface roughness and a critical dimension (CD) uniformity of the pattern of holes etched through the HM stack, as well an etch selectivity to the one or more underlying layers, during the first etch process by including the graduated hard mask layer within the HM stack.

The stacked structure formed in the method disclosed herein may include a wide variety of underlying layers, depending on the semiconductor memory device being formed. For example, when the semiconductor memory device is a dynamic random access memory (DRAM) device, said forming the one or more underlying layers on the semiconductor substrate may include forming a capacitor mold oxide above the semiconductor substrate and forming a first etch stop layer between the capacitor mold oxide and the graduated hard mask layer. In some embodiments, the first etch stop layer may be a silicon nitride (SiN) layer. In such embodiments, the larger atomic percentage of silicon included near the bottom of the graduated hard mask layer may improve the etch selectivity to the SiN layer during the first etch process.

When forming a DRAM device, additional etch processes may be performed to extend the pattern of holes through the underlying layer(s). For example, a second etch process may be performed to etch the pattern of holes through the first etch stop layer, and a third etch process may be performed to etch the pattern of holes through the capacitor mold oxide. After forming the pattern of holes within the capacitor mold oxide, the pattern of holes may be subsequently lined with a conductive material and filled with a dielectric material to form a plurality of capacitors for the DRAM device.

When the semiconductor memory device is a three dimensional (3D)-NAND Flash memory device, said forming the one or more underlying layers on the semiconductor substrate may include forming a multilayer vertical stack of alternating layers of dielectric material and conductive material above the semiconductor substrate. When forming a 3D-NAND flash memory device, a second etch process may be performed to etch the pattern of holes through the multilayer vertical stack to form contact holes, which are subsequently filled with a conductive material to connect individual memory cells of the 3D-NAND Flash memory device.

As noted above and described further herein, the present disclosure provides various embodiments of hard mask layers and methods for improving etch selectivity and critical dimension (CD) uniformity when etching HAR features within hard mask layers. Of course, the order of discussion of the different steps as described herein has been presented for the sake of clarity. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, the summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides various embodiments of stacked structures, process steps and methods for etching high aspect ratio (HAR) features (e.g., features having an aspect ratio ≥30:1) within stacked structures to reduce or eliminate problems that occur during conventional HAR etch processes. More specifically, the present disclosure provides novel hard mask layers and methods to improve etch selectivity and critical dimension (CD) uniformity when etching HAR features within hard mask layers.

A stacked structure in accordance with the present disclosure includes a hard mask (HM) stack, which is formed above and in contact with one or more underlying layers formed on a semiconductor substrate. The HM stack includes a hard mask layer containing a metal silicide nitride material. Unlike conventional hard mask layers, which have substantially uniform material composition, the material composition of the metal silicide nitride material varies across the thickness of the hard mask layer, resulting in a "graduated hard mask layer." In some embodiments, the graduated hard mask layer may contain a tungsten silicide nitride ($W_xSi_yN_z$) material, and the amount of tungsten (W), silicon (Si) and nitrogen (N) (e.g., the atomic percentage of W, Si and N) included within the graduated hard mask layer may change gradually between the top and the bottom of the graduated hard mask layer. When the stacked structure is subsequently etched to form HAR features (e.g., holes, vias, trenches, etc.) within the graduated hard mask layer, the different amounts of Si and N included within the graduated hard mask layer improve the etch profile, post-etch surface roughness and CD uniformity of the HAR features, as well as the etch selectivity to the underlying layer(s) formed on the semiconductor substrate or other semiconductor materials exposed on the substrate surface.

Figure 1:
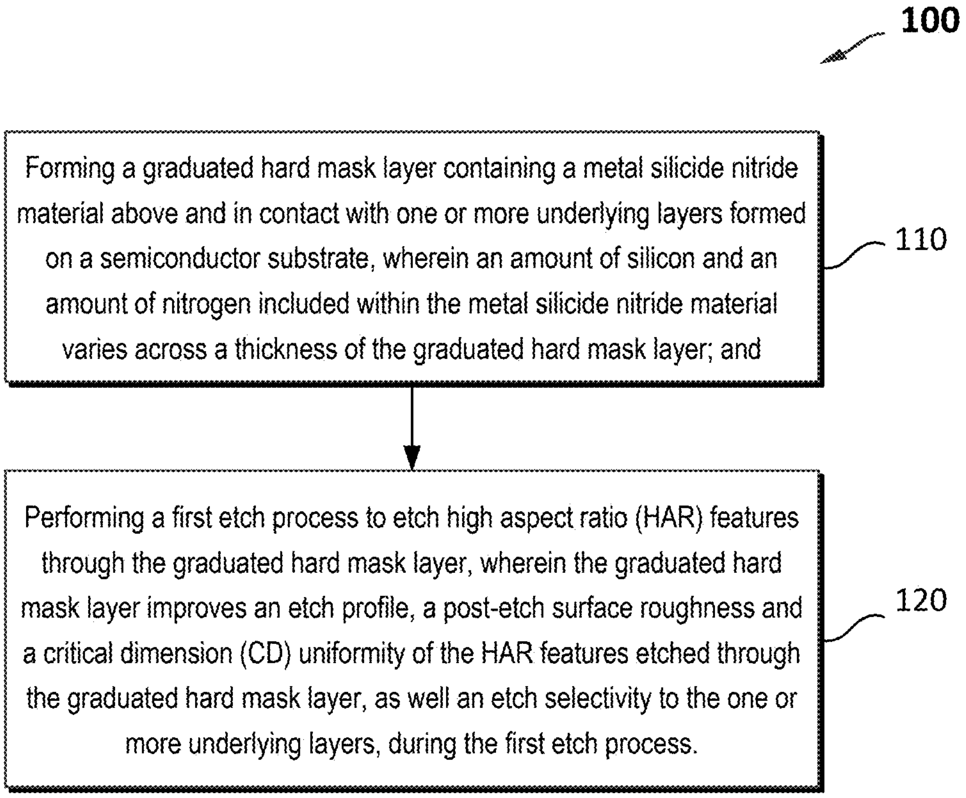
FIG. 1 is a flowchart diagram illustrating one embodiment of a method that utilizes the techniques described herein to etch high aspect ratio (HAR) features within a hard mask layer.

FIG. 1 is a flowchart diagram illustrating one embodiment of a method 100 that utilizes the techniques disclosed herein to etch high aspect ratio (HAR) features within a hard mask layer. It will be recognized that the embodiment of the method 100 shown in FIG. 1 is merely exemplary and additional methods may utilize the techniques disclosed herein. Further, additional processing steps may be added to the method 100 shown in FIG. 1 as the steps described are not intended to be exclusive. Moreover, the order of the steps is not limited to the order shown in the figures as different orders may occur and/or various steps may be performed in combination or at the same time.

The method 100 shown in FIG. 1 begins by forming a graduated hard mask layer containing a metal silicide nitride material above and in contact with one or more underlying layers formed on a semiconductor substrate (in step 110). The amount of silicon (Si) and nitrogen (N) included within the metal silicide nitride material varies across a thickness of the graduated hard mask layer. More specifically, the atomic percentage of silicon (Si at. %) and the atomic percentage of nitrogen (N at. %) included within the metal silicide nitride material varies across the thickness of the graduated hard mask layer and changes gradually between a top and a bottom of the graduated hard mask layer. The method 100 further includes performing a first etch process to etch the HAR features through the graduated hard mask layer (in step 120). Compared to conventional hard masks, the graduated hard mask layer used in the method 100 improves the etch profile, post-etch surface roughness and critical dimension (CD) uniformity of the HAR features etched through the graduated hard mask layer, as well the etch selectivity to the one or more underlying layers, during the first etch process.

In some embodiments, a smaller atomic percentage of Si (e.g., ranging between 0.1 at. % and 4 at. %) and a larger atomic percentage of N (e.g., ranging between 39 at. % and 43 at. %) may be included near the top of the graduated hard mask layer to improve the post-etch surface roughness and CD uniformity of the HAR features etched during the first etch process. In such embodiments, the amount of Si and N included within the graduated hard mask layer may gradually transition into a larger atomic percentage of Si (e.g., ranging between 21 at. % and 42 at. %) and a smaller atomic percentage of N (e.g., ranging between 0.1 at. % and 18 at. %) near the bottom of the graduated hard mask layer to improve the etch profile of the HAR features and the etch selectivity to the one or more underlying layers during the first etch process to reduce or avoid over etching.

In other embodiments, a larger atomic percentage of Si (e.g., ranging between 21 at. % and 42 at. %) and a smaller atomic percentage of N (e.g., ranging between 0.1 at. % and 18 at. %) may be included near the top of the graduated hard mask layer to improve an etch selectivity to other materials exposed on the substrate surface. In such embodiments, the amount of Si and N included within the graduated hard mask layer may gradually transition into a smaller atomic percentage of Si (e.g., ranging between 0.1 at. % and 4 at. %) and a larger atomic percentage of N (e.g., ranging between 39 at. % and 43 at. %) near the bottom of the graduated hard mask layer to improve the post-etch surface roughness and CD uniformity of the HAR features etched during the first etch process.

A wide variety of deposition processes can be used to form the graduated hard mask layer in step 110. For example, the graduated hard mask layer can be formed using an atomic layer deposition (ALD) process, a chemical vapor deposition (CVD) process, a plasma enhanced CVD (PECVD) process, a physical vapor deposition (PVD) process, a plasma assisted PVD (PAPVD) process, or other deposition processes or combinations of processes.

In one example embodiment, a PVD process is used to deposit a metal silicide nitride material on the underlying layer(s). During the PVD process, one or more process parameters are adjusted to vary the amount of Si and N included within the metal silicide nitride material, as the metal silicide nitride material is deposited, to form the graduated hard mask layer described herein. For example, the plasma power and/or nitrogen ($N_2$) gas flow rate may be continually or periodically adjusted during the PVD process to vary the amount of Si and N included within the metal silicide nitride material and form the graduated hard mask layer in step 110.

The graduated hard mask layer disclosed herein may include a wide variety of metal silicide nitride materials. For example, the graduated hard mask layer may include, tungsten silicide nitride ($W_xSi_yN_z$), titanium silicide nitride ($Ti_xSi_yN_z$), cobalt silicide nitride ($Co_xSi_yN_z$), nickel silicide nitride ($Ni_xSi_yN_z$), aluminum silicide nitride ($Al_xSi_yN_z$), molybdenum silicide nitride ($Mo_xSi_yN_z$), tantalum silicide nitride ($Ta_xSi_yN_z$) and platinum silicide nitride ($Pt_xSi_yN_z$), etc. Other metal silicide nitride materials may also be utilized to form the graduated hard mask layer in step 110. In one embodiment, the graduated hard mask layer may comprise tungsten silicide nitride ($W_xSi_yN_z$). As described in more detail, a $W_xSi_yN_z$ hard mask with gradually changing material composition was found to provide better etch selectivity and CD uniformity than a $W_xSi_y$ hard mask of uniform material composition during etch processes performed to open HAR features within the hard mask materials.

The method 100 shown in FIG. 1 utilizes a graduated hard mask layer to improve the etch profile, post-etch surface roughness and CD uniformity of HAR features etched within the hard mask layer, as well as the etch selectivity to the one or more underlying layers formed beneath the hard mask layer. The HAR features etched within the graduated hard mask layer may include a wide variety of features, including holes, vias, trenches, etc., having aspect ratios greater than or equal to 30:1. In some embodiments, the thickness of the graduated hard mask layer may range between approximately 300 nm and 1000 nm, and the HAR features etched through the graduated hard mask layer may have an aspect ratio ranging between 30:1 and 100:1.

In some embodiments, the graduated hard mask layer may be included within a hard mask (HM) stack, which is used to etch a pattern of features (e.g., a pattern of holes, vias, trenches, etc.) within one or more underlying layers formed beneath the HM stack. The pattern of features may be etched within a wide variety of underlying layers, including dielectric layers, conductive layers and other semiconductor materials. In some embodiments, the HM stack and the underlying layers may be included within a stacked structure used to form a semiconductor memory device. In one example embodiment, the underlying layers may include a capacitor mold oxide, which is used as a dielectric support layer for the capacitors of a DRAM memory device. In such an embodiment, the HM stack formed above the underlying layers may be used to etch HAR holes within the capacitor mold oxide that are subsequently lined and filled to form the capacitors. In another example embodiment, the underlying layers may include a multilayer vertical stack of alternating layers of dielectric and conductive material used to form individual memory cells of a 3D-NAND flash memory device. In such an embodiment, the HM stack formed above the underlying layers may be used to etch HAR holes within the multilayer vertical stack, which are subsequently filled with a conductive material to form connections between the individual memory cells of the 3D-NAND flash memory.

Figure 2:
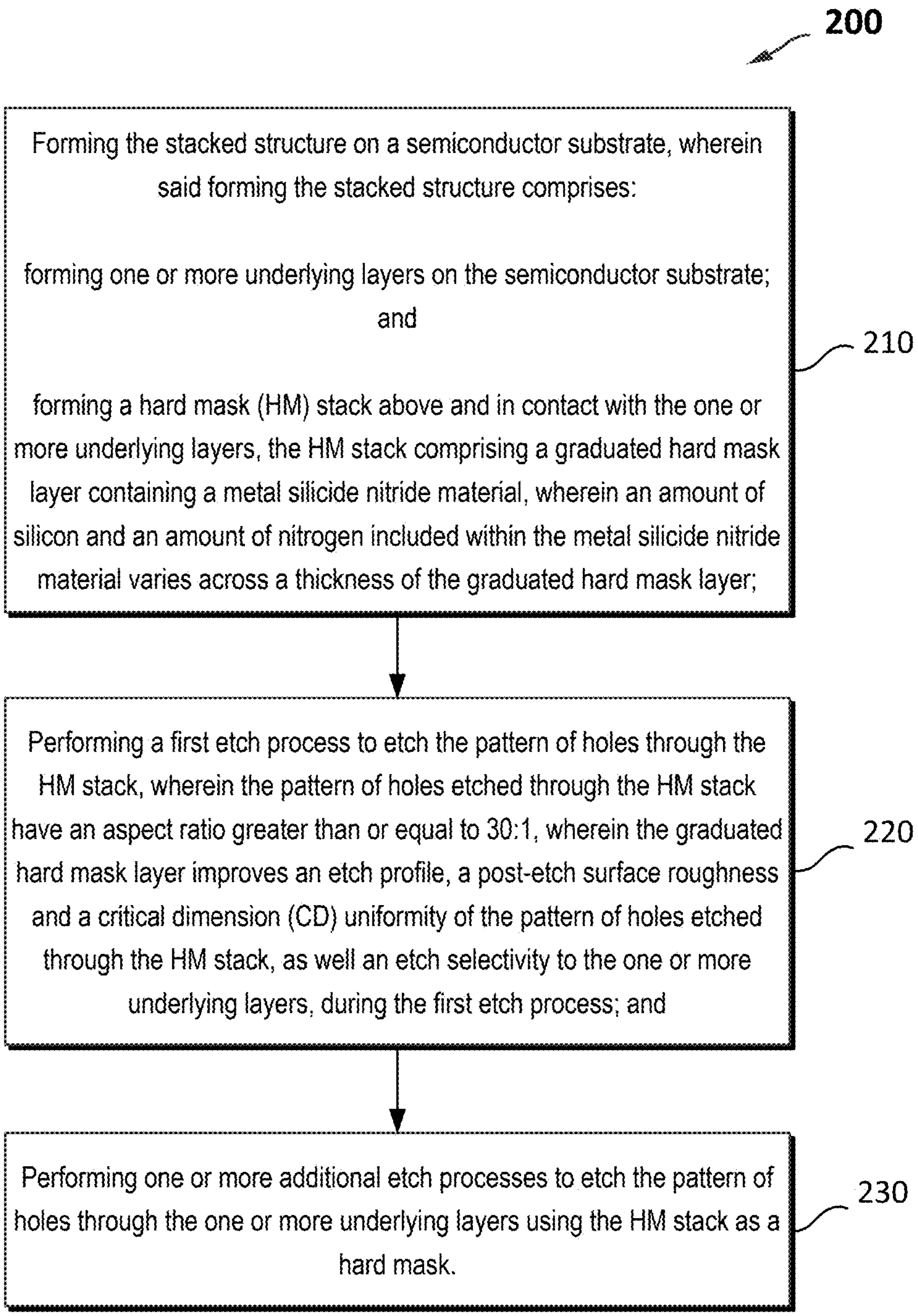
FIG. 2 is a flowchart diagram illustrating one embodiment of a method that utilizes the techniques described herein to etch a pattern of holes within a stacked structure included within a semiconductor memory device.

FIG. 2 is a flowchart diagram illustrating one embodiment of a method 200 that utilizes the techniques disclosed herein to etch a pattern of holes within a stacked structure included within a semiconductor memory device. It will be recognized that the embodiment of the method shown in FIG. 2 is merely exemplary and additional methods may utilize the techniques disclosed herein. Further, additional processing steps may be added to the method shown in FIG. 2 as the steps described are not intended to be exclusive. Moreover, the order of the steps is not limited to the order shown in the figures as different orders may occur and/or various steps may be performed in combination or at the same time.

The method 200 shown in FIG. 2 begins by forming the stacked structure on a semiconductor substrate (in step 210). The stacked structure may generally be formed by: (a) forming one or more underlying layers on the semiconductor substrate, and (b) forming a hard mask (HM) stack above and in contact with the one or more underlying layers. Other layers may also be included within the stacked structure.

The HM stack includes a graduated hard mask layer containing a metal silicide nitride material (e.g., a $W_xSi_yN_z$ material). Like the previous embodiment shown in FIG. 1, the graduated hard mask layer included within the HM stack is formed by varying the amount of Si and N included within the metal silicide nitride material across the thickness of the graduated hard mask layer. More specifically, the graduated hard mask layer is formed by varying one or more deposition process parameters, as the metal silicide nitride material is deposited, so that the atomic percentage of silicon (Si at. %) and the atomic percentage of nitrogen (N at. %) included within the metal silicide nitride material change gradually between a top and a bottom of the graduated hard mask layer. In one embodiment, the graduated hard mask layer is formed by: (a) depositing a metal silicide nitride material on the underlying layer(s) using a PVD process, and (b) continually or periodically adjusting the plasma power and/or the nitrogen ($N_2$) gas flow rate during the PVD process to vary the amount of Si and N included within the metal silicide nitride material, as the metal silicide nitride material is being deposited.

In some embodiments, the HM stack formed in step 210 may include one or more additional hard mask layers. For example, the HM stack may include a silicon-containing hard mask layer formed above and in contact with the graduated hard mask layer, and a carbon-containing hard mask layer formed above and in contact with the silicon-containing hard mask layer. In one example embodiment, the carbon-containing hard mask layer may be an amorphous carbon layer (ACL) hard mask layer, and the silicon-containing hard mask layer may be an amorphous silicon (a-Si) hard mask layer, a polycrystalline silicon (poly-Si) hard mask layer, a silicon dioxide ($SiO_2$) hard mask layer and/or another silicon-containing hard mask layer. When additional hard mask layers are included within the HM stack, the thickness of the HM stack may range between approximately 1 μm and 3.5 μm.

The method 200 further includes performing a first etch process to etch the pattern of holes through the HM stack (in step 220) and performing one or more additional etch processes to etch the pattern of holes through the one or more underlying layers using the HM stack as a hard mask (in step 230). Due to the thickness of the HM stack and the relatively small diameter of the pattern of holes etched through the HM stack, the holes etched in step 220 are HAR features having an aspect ratio ranging between 30:1 to 40:1. Compared to conventional HAR etch processes used to etch deep holes within relatively thick hard mask layers, the method 200 shown in FIG. 2 improves the etch profile, post-etch surface roughness and critical dimension (CD) uniformity of the pattern of holes etched through the HM stack, as well as the etch selectivity to the one or more underlying layers, during the first etch process (in step 220) by including the graduated hard mask layer within the HM stack (in step 210).

The stacked structure formed in step 210 may include a wide variety of underlying layers, depending on the semiconductor memory device being formed. For example, when the semiconductor memory device is a DRAM device, the underlying layer(s) may include a capacitor mold oxide (such as, e.g., silicon dioxide, $SiO_2$) formed above the semiconductor substrate, and a first etch stop layer (such as, e.g., a silicon nitride (SiN) etch stop layer) formed between the capacitor mold oxide and the graduated hard mask layer. Additional examples of capacitor mold oxides and etch stop materials may also be used, as discussed in more detail below in reference to FIG. 3A. When forming a DRAM device, additional etch processes may be performed in step 230 to extend the pattern of holes through the underlying layer(s). For example, a second etch process may be performed to etch the pattern of holes through the first etch stop layer, and a third etch process may be performed to etch the pattern of holes through the capacitor mold oxide. Alternatively, a single etch process may be used to extend the pattern of holes through the first etch stop layer and the capacitor mold oxide. After forming the pattern of holes within the capacitor mold oxide, the holes are lined with a conductive material and filled with a dielectric material to form a plurality of capacitors for the DRAM device.

When the semiconductor memory device is a 3D-NAND flash memory device, the underlying layer(s) formed in step 210 may include a multilayer vertical stack of alternating layers of dielectric material and conductive material such as, for example, alternating layers of oxide and nitride (ONON), alternating layers of silicon oxide and polysilicon (OPOP), etc. When forming a 3D-NAND flash memory device, a second etch process may be performed in step 230 to etch the pattern of holes through the multilayer vertical stack to form contact holes, which are subsequently filled with a conductive material to connect individual memory cells of the 3D-NAND Flash memory device.

FIGS. 3A-3E illustrate an example process flow that utilizes the techniques disclosed herein to improve etch selectivity and CD uniformity when etching HAR features within a hard mask layer provided within a stacked structure. In FIGS. 3A-3E, cross-section views are provided for example embodiments of stacked structures and process steps that reduce or eliminate problems that occur during conventional HAR etch processes. It is noted that these cross-section views are in a first direction perpendicular to the HAR features (e.g., a pattern of holes) being formed within the stacked structure. Although only one HAR feature is shown in the figures, it is generally recognized that the etch processes shown in FIGS. 3C and 3D may be used to form a plurality of HAR features within the stacked structure.

In some embodiments, the process steps shown in FIGS. 3A-3E may be used as part of a memory fabrication process where the hard mask layers within the HM stack are opened to provide a pattern of holes to be transferred to one or more layers underlying the HM stack. For example, the process steps shown in FIGS. 3A-3E can be used to etch a pattern of high aspect ratio holes, which may be subsequently lined with a conductive material and filled with a dielectric material to form a plurality of capacitors for a DRAM device. However, it is recognized that similar process steps can be used to etch other high aspect ratio features (including, e.g., contact holes, vias and trenches) within the hard mask layers of a HM stack.

It is further recognized that the material layers and layer depths shown in FIGS. 3A-3E are not drawn to scale. In particular, the depth of the hard mask layers included within the HM stack are exaggerated to illustrate the inventive concepts described herein, while the depth and material composition of the underlying layer(s) is minimized to maintain focus on the hard mask layers. One skilled in the art would recognize that, in practice, the depth of a capacitor mold oxide utilized in DRAM memory applications would be much larger than the depth of the hard mask layers used to pattern the capacitor mold oxide.

Figure 3A:
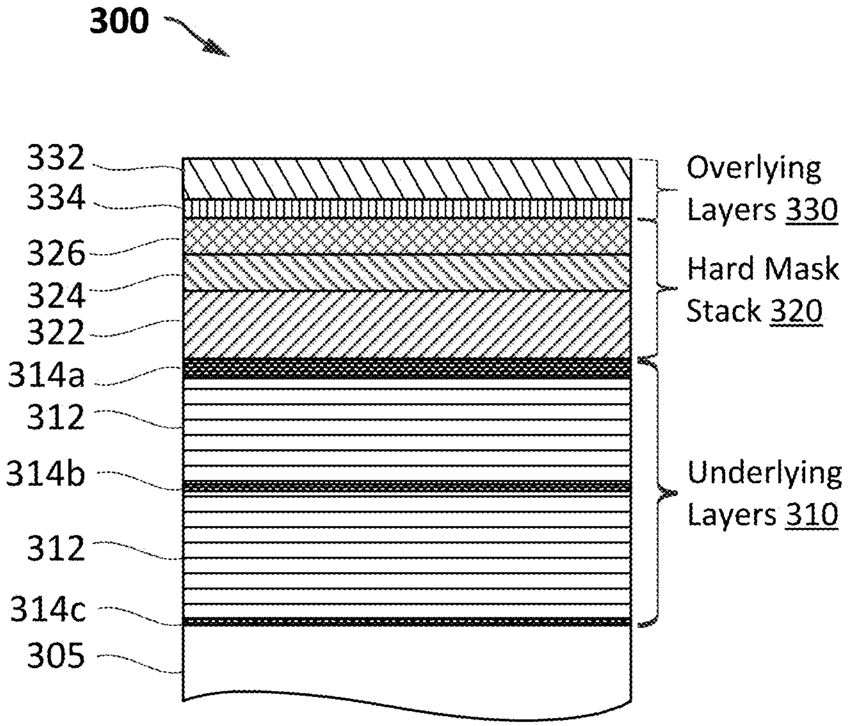
FIGS. 3A-3E illustrate an example process flow for etching high aspect ratio (HAR) features within a stacked structure.

FIG. 3A illustrates a process step where a stacked structure 300 has been formed on a base layer 305, such as a semiconductor substrate. In the embodiment shown in FIG. 3A, the stacked structure 300 includes one or more underlying layers 310 formed on the base layer 305, a hard mask (HM) stack 320 formed on top of the underlying layer(s) 310, and one or more overlying layers 330 formed on top of the HM stack 320. The HM stack 320 includes a hard mask layer containing a metal silicide nitride material. Unlike conventional hard mask layers, which have substantially uniform material composition, the material composition of the metal silicide nitride material varies across the thickness of the hard mask layer, resulting in a graduated hard mask layer 322.

The graduated hard mask layer 322 contains a metal silicide nitride material having a graduated material composition. Specifically, the amount of silicon (Si) and the amount of nitrogen (N) included within the metal silicide nitride material varies across the thickness of the graduated hard mask layer. More specifically, the atomic percentage of silicon (Si at. %) and the atomic percentage of nitrogen (N at. %) included within the metal silicide nitride material varies across the thickness of the graduated hard mask layer 322 and changes gradually between a top and a bottom of the graduated hard mask layer 322. Examples of metal silicide nitride materials that may be used to form the graduated hard mask layer 322 are discussed above.

In one example embodiment, the graduated hard mask layer 322 comprises a tungsten silicide nitride ($W_xSi_yN_z$) material having a larger atomic percentage of silicon (e.g., ranging between 21 at. % and 42 at. %) and a smaller atomic percentage of nitrogen (e.g., ranging between 0.1 at. % and 18 at. %) near the bottom of the graduated hard mask layer, which gradually transitions into a smaller atomic percentage of silicon (e.g., ranging between 0.1 at. % and 4 at. %) and a larger atomic percentage of nitrogen (e.g., ranging between 39 at. % and 43 at. %) near the top of the graduated hard mask layer 322.

In some embodiments, the HM stack 320 may further include one or more additional hard mask layers above the graduated hard mask layer 322. For example, the HM stack 320 may include a silicon-containing hard mask layer 324 (such as, e.g., an a-Si, poly-Si or $SiO_2$ hard mask layer) formed above and in contact with the graduated hard mask layer 322, and a carbon-containing hard mask layer 326 (such as, e.g., an ACL hard mask layer) formed above and in contact with the silicon-containing hard mask layer 324, as shown in FIG. 3A.

The hard mask layers included within the HM stack 320 may have a variety of deposition thicknesses. In some embodiments, the graduated hard mask layer 322 may be approximately 300 nm to 1000 nm thick, the silicon-containing hard mask layer 324 may be approximately 300 nm to 1000 nm thick, and the carbon-containing hard mask layer 326 may be approximately 250 nm to 1000 nm thick. When additional hard mask layer(s) are included within the HM stack 320, the overall thickness of the HM stack 320 may range between 0.85 μm and 3.0 μm.

The HM stack 320 shown in FIG. 3A may be utilized for etching a wide variety of underlying layer(s) 310 including, but not limited to, a dielectric layer 312. The dielectric layer 312 may include a wide variety of dielectric materials, such as silicon dioxide ($SiO_2$), silicon carbide (SiC), silicon carbon nitride (SiCN), etc. In some embodiments, the dielectric layer 312 may be a capacitor mold oxide, which is used as a dielectric support layer for the capacitors included within a DRAM device. In some embodiments, silicon dioxide ($SiO_2$) may be used as the capacitor mold oxide.

The underlying layer(s) 310 may further include one or more etch stop layers. For example, a first etch stop layer **314*a* may be formed between the graduated hard mask layer 322 and the dielectric layer 312 to provide an etch stop for the "Mask Open" step 360 shown in FIG. 3C. In some embodiments, additional etch stop layer(s) may be formed within and/or beneath the dielectric layer 312 to provide additional etch stop(s) for the "Dielectric Etch" step 370 shown in FIG. 3D. For example, a second etch stop layer 314*b* may be formed within the dielectric layer 312 and a third etch stop layer 314*c* may be formed beneath the dielectric layer 312, as shown in FIG. 3A**. The etch stop layer(s) may include an oxide, nitride, carbide, metal oxide, metal nitride, metal carbide, other dielectric material layer(s) or combinations of layers. In some embodiments, the etch stop layer(s) may include silicon nitride (SiN).

A wide variety of overlying layer(s) 330 may be formed above the HM stack 320 and used to etch a pattern of holes within the HM stack 320. For example, the one or more overlying layers 330 may include a photoresist (PR) layer 332 and an antireflective coating (ARC) layer 334, as shown in FIG. 3A. The PR layer 332 may include any photoresist used in 193 nm immersion technology, including positive tone and negative tone photoresist layers. The ARC layer 334 may include a silicon-containing ARC (SiARC) or a bottom ARC (BARC).

In one example embodiment, the stacked structure 300 shown in FIG. 3A may include a 15-60 nm PR layer 332, a 20-40 nm ARC layer 334, a 0.85-3.0 μm HM stack 320 comprising a 300-1000 nm silicon-containing hard mask layer 324, a 250-1000 nm carbon-containing hard mask layer 326 and a 300-1000 nm graduated hard mask layer 322, a 1-3 μm dielectric layer 312, a 100-300 nm first etch stop layer 314*a*, a 15-45 nm second etch stop layer 314*b* and a 15-45 nm third etch stop layer 314*c*, all of which is formed on a silicon substrate base layer 305. It is recognized that other layers may be included within the stacked structure 300, as is known in the art.

A wide variety of deposition techniques may be used to form the various layers included within the stacked structure 300 shown in FIG. 3A. For example, layers 312, 314, 322, 324, 326, 332 and 334 can be formed using an atomic layer deposition (ALD) process, a chemical vapor deposition (CVD) process, a plasma enhanced CVD (PECVD) process, a physical vapor deposition (PVD) process, a plasma-assisted physical vapor deposition (PAPVD) process, or other deposition processes or combinations of processes. Such processes may begin, for example, by depositing the underlying layer(s) 310 on the base layer 305.

Once the underlying layer(s) 310 are formed, a first deposition process may be used to form the graduated hard mask layer 322 on the underlying layer(s) 310. In some embodiments, the graduated hard mask layer 322 may be formed by: (a) depositing a metal silicide nitride material on the underlying layer(s) 310 using a PVD process, and (b) continually or periodically adjusting one or more process parameters during the PVD process to vary the amount of Si and N included within the metal silicide nitride material, as the metal silicide nitride material is deposited.

In one example embodiment, a PVD process may be used to form the graduated hard mask layer 322. In PVD processes, the material to be deposited is evaporated from a solid or liquid source and carried in the form of plasma to the semiconductor substrate, where it condenses on the substate surface. To form a tungsten silicide nitride ($W_xSi_yN_z$) hard mask having a gradually changing material composition, a W, Si material may be evaporated to form a vapor that condenses on the substrate surface. Nitrogen ($N_2$) and argon (Ar) gases may also be supplied to the PVD chamber and combined with the vapor to form a $W_xSi_yN_z$ compound that is deposited onto the underlying layer(s) 310. During the PVD process, the plasma power and/or $N_2$ gas flow rate is continually or periodically adjusted to vary the atomic percentage of silicon and nitrogen included within the $W_xSi_yN_z$ material, as the $W_xSi_yN_z$ material is deposited on the underlying layer(s) 310. For example, the plasma power may be adjusted between 0.7 W/cm$^2$ and 3.0 W/cm$^2$, and the Ar/$N_2$ gas ratio may be adjusted between 0 and 100, during the PVD process.

In some embodiments, additional deposition processes may be performed after the first deposition process to deposit the additional hard mask layers 324/326 on the graduated hard mask layer 322 to form the HM stack 320 before the overlying layers 330 are deposited onto the HM stack 320. The deposition processes used to form the layers 324, 326, 332 and 334 may use the same (or different) deposition technique used to deposit the graduated hard mask layer 322 (e.g., PVD), or a different deposition technique (e.g., CVD, ALD, etc.), and suitable process gases. Such techniques and process gases may be known to those skilled in the art.

Figure 3B:
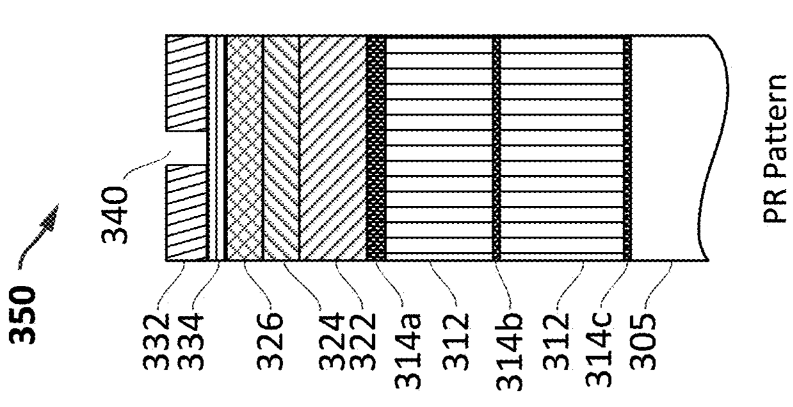

Once the layers 310, 320 and 330 are formed, one or more photolithography and etch process steps may be performed to etch a pattern of features 340 within the one or more overlying layers 330 formed above the HM stack 320. FIG. 3B illustrates a photoresist (PR) patterning step 350, which utilizes a photolithography process to create a pattern of features 340 (e.g., a pattern of holes) within the PR layer 332 and ARC layer 334. Only one feature 340 is shown in FIG. 3B for the sake of drawing clarity.

Figure 3C:
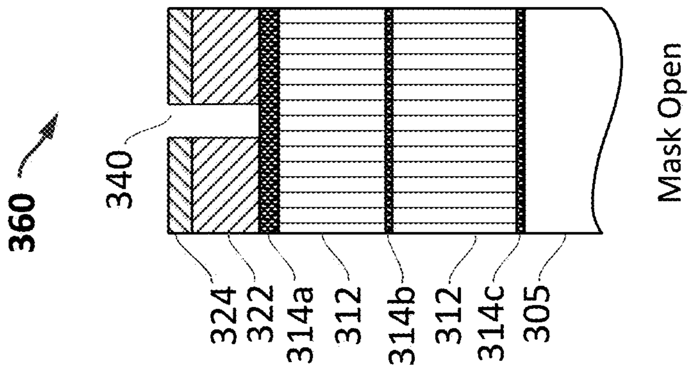

FIG. 3C illustrates a "Mask Open" step 360 in which one or more etch processes are performed to etch (or "open") the pattern of features 340 with the HM stack 320. In some cases, the etch process(es) used to open the HM stack 320 may be implemented as one or more plasma etch process steps. As shown in FIG. 3C, the additional hard mask layers 324 and 326 are utilized as a hard mask during the mask open step to pattern the graduated hard mask layer 322. As the HM stack 320 is etched, ion bombardment on the surface of the additional hard mask layers 324/326 may cause portions of the additional hard mask layers 324/326 to be removed. In some cases, some or all of the additional hard mask layers 324/326 formed above the graduated hard mask layer 322 may be removed during the Mask Open step 360 shown in FIG. 3C.

As the pattern of features 340 are etched deeper within the graduated hard mask layer 322, the atomic percentage of N included within the graduated hard mask layer 322 gradually decreases, while the atomic percentage of Si included within the graduated hard mask layer 322 gradually increases. The larger atomic percentage of Si included near the bottom of the graduated hard mask layer 322 improves selectivity to the first etch stop layer 314*a* near the end of the etch process(es). The increased selectivity enables the etch process(es) used to open the HM stack 320 to stop on the first etch stop layer 314*a*, as shown in FIG. 3C, without significant over-etching.

Figure 3D:
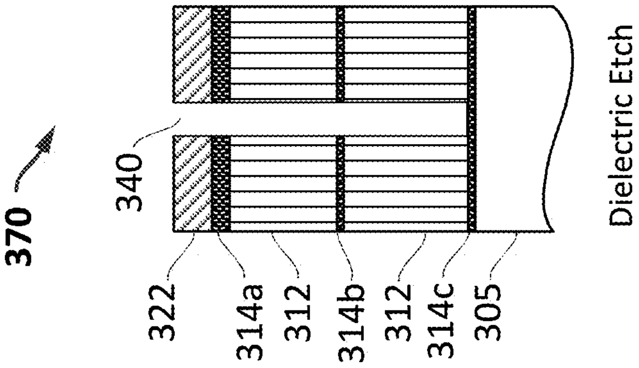
Figure 3E:
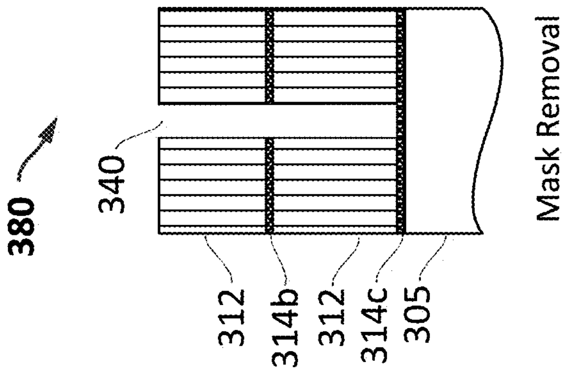

After etching the pattern of features 340 withing the HM stack 320, a "Dielectric Etch" step 370 may be performed to extend the pattern of features 340 through the underlying layer(s) 310. The dielectric etch process may also be implemented as one or more plasma etch process steps. As shown in FIG. 3D, the HM stack 320 is utilized as a hard mask during the dielectric etch process. As the underlying layer(s) 310 is/are etched, ion bombardment on the surface of the HM stack 320 causes portions of the graduated hard mask layer 322 to be removed. In some cases, some or all of the graduated hard mask layer 322 may be removed during the "Dielectric Etch" step 370. Once the features 340 are fully etched within the underlying layer(s) 310, remaining portions of the graduated hard mask layer 322 may be removed from the surface of the underlying layer(s) 310 in the "Mask Removal" step 380 shown in FIG. 3E. For example, plasma etching or ashing may be used to remove any remaining portions of the graduated hard mask layer 322 in FIG. 3E.

A wide variety of etch techniques can be used to etch the pattern of features 340 within the individual layers of the stacked structure 300 shown in FIG. 3A. For example, these layers can be etched using one or more etch processes including plasma etch processes, discharge etch processes, atomic layer etch (ALE) processes and/or other desired etch processes. In some embodiments, an inductively coupled plasma (ICP) process and/or a capacitively coupled plasma (CCP) process may be used to etch the pattern of features 340 within the stacked structure 300 in FIGS. 3C and 3D.

In some embodiments, an ICP etch process may be used to etch the pattern of features 340 within the HM stack 320 in the "Mask Open" step 360. During the mask open etch process, one or more gas mixtures may be supplied to the process chamber and used at a variety of pressure, power, flow and temperature conditions to etch the HM stack 320. The gas mixture(s) may include a wide variety of process gases, including chlorine-containing process gases (such as, e.g., chlorine ($Cl_2$), boron trichloride ($BCl_3$), etc.), sulfur-containing process gases (such as sulfur dioxide ($SO_2$)) and fluorocarbon process gases (such as, e.g., $C_4F_6$, $C_4F_8$, $C_3F_6$, $CsF_8$, $CH_2F_2$, $CHF_3$, $CF_4$, etc.) optionally in combination with oxygen ($O_2$), nitrogen ($N_2$) and hydrogen ($H_2$). One or more dilution gases (e.g., argon, helium, krypton, etc.) may also be supplied to the process chamber. The process parameters used during in the "Mask Open" step 360 (e.g., process gases, power, pressure, temperature, etc.) may vary depending on the hard mask materials included within the HM stack 320 and the material composition of the underlying layer(s) 310.

In some embodiments, the "Mask Open" step 360 may utilize different gas mixtures for etching the various hard mask layers of the HM stack 320. For example, sulfur dioxide ($SO_2$) and oxygen ($O_2$) process gases may be used to etch the carbon-containing hard mask layer 326, and chlorine ($Cl_2$), oxygen ($O_2$) and argon (Ar) may be used to etch the silicon-containing hard mask layer 324. The graduated hard mask layer 322 may be etched using a mixture of chlorine ($Cl_2$), boron trichloride ($BCl_3$), sulfur dioxide ($SO_2$) and a fluorocarbon process gas ($C_xF_y$), in addition to oxygen ($O_2$), nitrogen ($N_2$) and hydrogen ($H_2$). In other embodiments, the same gas mixture used to etch the graduated hard mask layer 322 may be used to etch all hard mask layers within the HM stack 320.

In one example embodiment, the process gasses utilized in the "Mask Open" step 360 may include a $Cl_2$ gas flow in a range of 50-250 standard cubic centimeters per minute (sccm), a $BCl_3$ gas flow in a range of 5-50 sccm, a $SO_2$ gas flow in a range of 50-150 sccm, a $C_4F_6$ gas flow in a range of 5-50 sccm, an $O_2$ gas flow in the range of 50-200 sccm, a $N_2$ gas flow in the range of 10-200 sccm, and an $H_2$ gas flow in the range of 5-50 sccm, optionally in combination with one or more dilution gases, such as argon (Ar) in the range of 50-150 sccm. The "Mask Open" step 360 may also utilize a source power (high frequency) in a range of 0-1500 W, a bias power (low frequency) in a range of 0-1900 W, a pressure in a range of 5-700 mTorr, and a temperature in a range of 0-90 degrees Celsius.

In some embodiments, a CCP etch process may be used to etch the pattern of features 340 within the underlying layer(s) 310 in the "Dielectric Etch" step 370. During the dielectric etch process, one or more gas mixtures may be supplied to the process chamber and used at a variety of pressure, power, flow and temperature conditions to etch the underlying layer(s) 310. The gas mixture(s) used during the dielectric etch process may include a wide variety of process gases, including hydrofluorocarbon process gases ($C_xH_yF_z$, such as, e.g., $CH_2F_2$, $CHF_3$, $CF_4$, $C_4F_6$, and/or $C_4F_8$), fluorine-containing gases (such as, e.g., nitrogen trifluoride ($NF_3$)) and oxygen-containing gases (such as $O_2$), optionally in combination with one or more dilution gases (e.g., argon, nitrogen, etc.). The process parameters used during in the "Dielectric Etch" step 370 (e.g., process gases, power, pressure, temperature, etc.) may vary depending on the material composition of the underlying layer(s) 310.

In one example embodiment, the process gasses utilized in the "Dielectric Etch" step 370 may include a $C_xH_yF_z$ gas flow in a range of 50-150 sccm, a $NF_3$ gas flow in a range of 3-30 sccm, and an $O_2$ gas flow in the range of 10-100 sccm, a $N_2$ gas flow in the range of 30-300 sccm, optionally in combination with one or more dilution gases, such as argon (Ar) in the range of 100-200 sccm. The "Dielectric Etch" step 370 may also utilize a source power (high frequency) in a range of 0-1500 W, a bias power (low frequency) in a range of 0-1900 W, a pressure in a range of 5-700 mTorr, and a temperature in a range of 0-90 degrees Celsius.

Various embodiments of stacked structures, process steps and methods for etching high aspect ratio features (e.g., contact holes, vias, trenches, etc.) within a hard mask layer have been described above in reference to FIGS. 1-3. In some embodiments, the techniques described herein may be particularly well suited for etching high aspect ratio features (e.g., features with aspect ratios ≥30:1) within relatively thick (e.g., about 1-3.5 μm) HM stacks. In one example implementation, the techniques described herein may be used to etch ~20 nm holes spaced ~20 nm apart within an approximately 1-3.5 μm HM stack comprising a graduated hard mask layer, optionally with one or more additional hard mask layers.

The techniques described herein improve the etch profile, post-etch surface roughness and CD uniformity of HAR features etched within the HM stack 320, while also improving the etch selectivity during the mask open step by including a graduated hard mask layer 322 within the HM stack 320. As noted above, the graduated hard mask layer 322 may include a larger atomic percentage of Si and a smaller atomic percentage of N near the bottom of the graduated hard mask layer 322, which gradually transitions into a smaller percentage of Si and a larger percentage of N near the top of the graduated hard mask layer 322. When an etch process is subsequently performed to etch or "open" HAR features within the graduated hard mask layer 322, as shown in FIG. 3C, the larger atomic percentage of N included near the top of the graduated hard mask layer 322 improves CD uniformity of the HAR features by reducing pitting and post-etch surface roughness. As the HAR features are etched deeper within the graduated hard mask layer 322, the atomic percentage of N included within the graduated hard mask layer 322 decreases and the atomic percentage of Si included within the graduated hard mask layer 322 increases. Near the end of the mask open etch process, the larger atomic percentage of Si included near the bottom of the graduated hard mask layer 322 improves the etch profile of the HAR features etched within the HM stack 320, while also improving the selectivity to the underlying layer(s) 310 (e.g., the first etch stop layer 314*a*) to avoid over etching.

Figure 4:
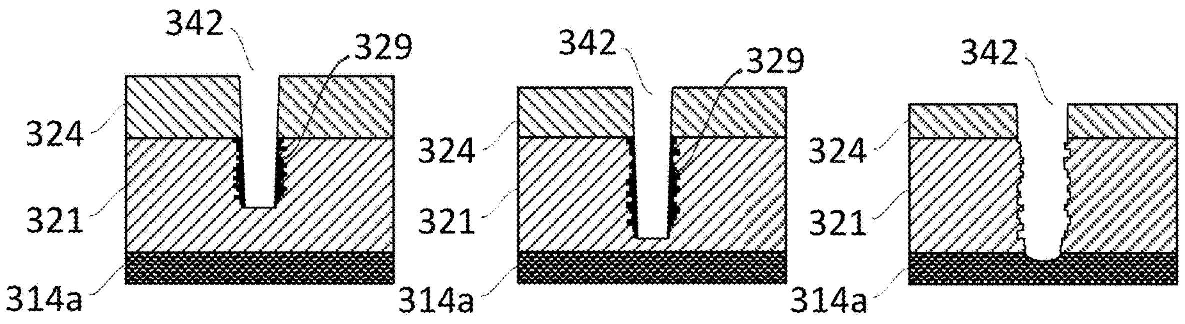
FIG. 4 are cross-section views through a portion of the stacked structure shown in FIG. 3C, illustrating an etch process used to etch HAR features within a hard mask stack containing a metal silicide (e.g., tungsten silicide, $W_xSi_y$) hard mask layer.
Figure 5:
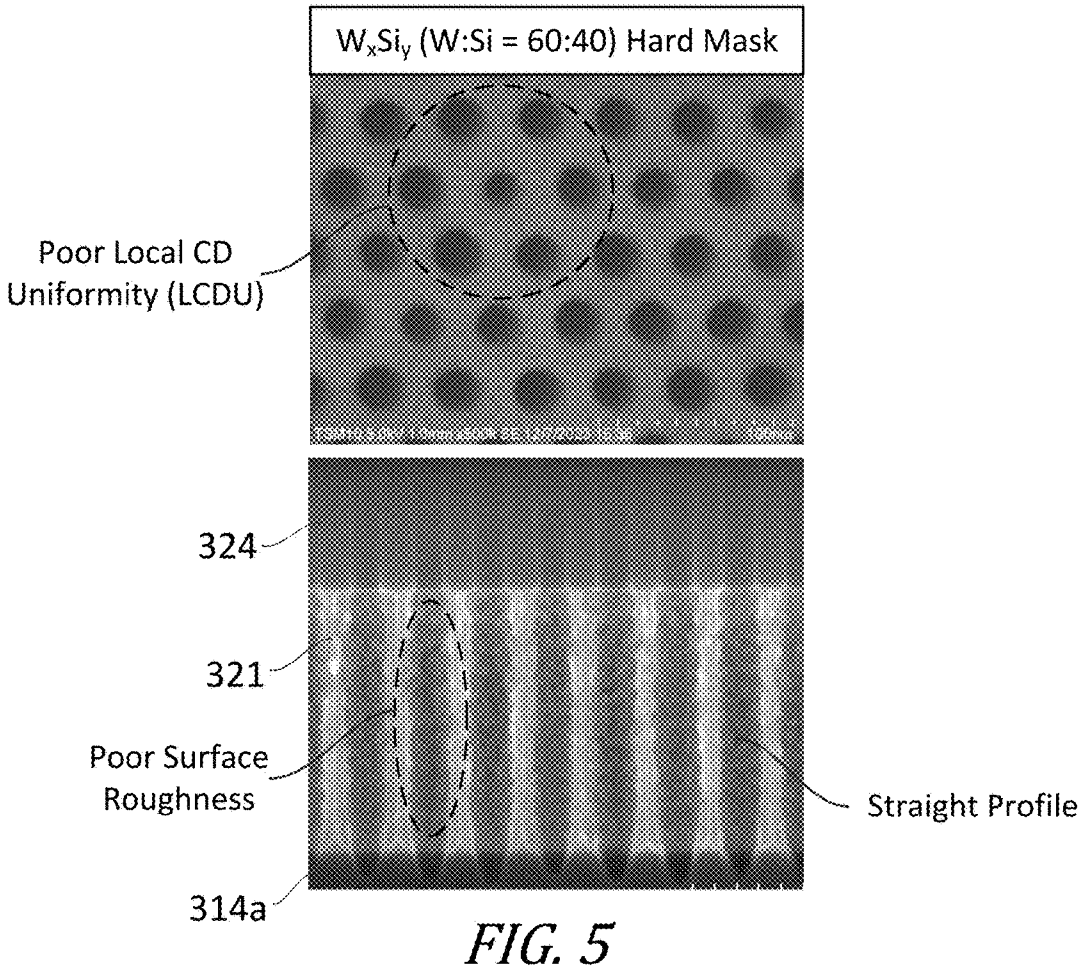
FIG. 5 provides top-down and cross-sectional views of HAR features etched within a hard mask stack containing a metal silicide (e.g., a tungsten silicide, $W_xSi_y$) hard mask layer.

Experiments were conducted to determine an optimum material composition for the graduated hard mask layer 322. In a first experiment, a tungsten silicide ($W_xSi_y$) hard mask layer 321 having a uniform composition of 60 at. % tungsten (W) and 40 at. % silicon (Si) was deposited on the first etch stop layer 314*a* in place of the graduated hard mask layer 322 shown in FIGS. 3A-3E and described above. FIGS. 4 and 5 illustrate results of an etch process used to etch a pattern of features 342 within a HM stack containing a 250 nm carbon-containing hard mask layer 326 (e.g., ACL, not shown), a 300 nm silicon-containing hard mask layer 324 (e.g., $SiO_2$), and a 300 nm $W_xSi_y$ hard mask layer 321. As shown in FIG. 4, thick, high density silicon dioxide ($SiO_2$) 329 is deposited onto the sidewalls of the $W_xSi_y$ hard mask layer 321 as the features 342 are etched within the $W_xSi_y$ hard mask layer 321. Although use of the $W_xSi_y$ layer 321 provides a relatively straight etch profile and good selectivity to the underlying etch stop layer 314*a* during the mask open etch process, it suffers from poor post-etch surface roughness and poor local CD uniformity (LCDU) of the features 342 after the dielectric etch process, as shown in FIG. 5.

Figure 6:
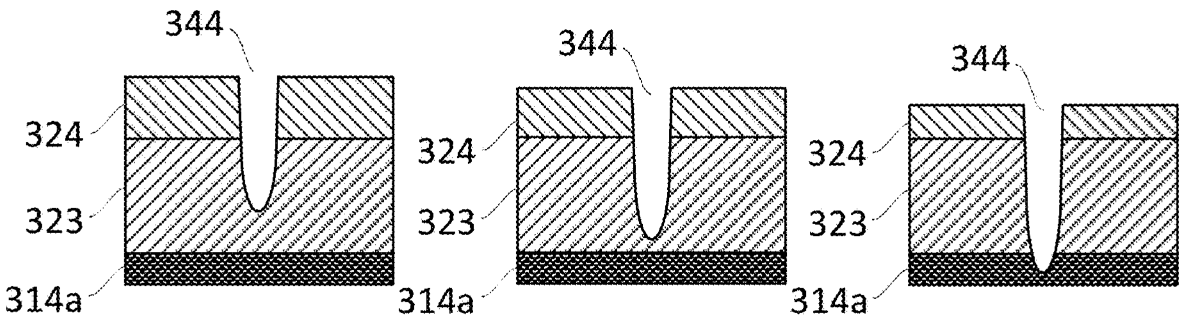
FIG. 6 are cross-section views through a portion of the stacked structure shown in FIG. 3C, illustrating an etch process used to etch HAR features within a hard mask stack containing a metal silicide nitride (e.g., tungsten silicide nitride, $W_xSi_yN_z$) hard mask layer.
Figure 7:
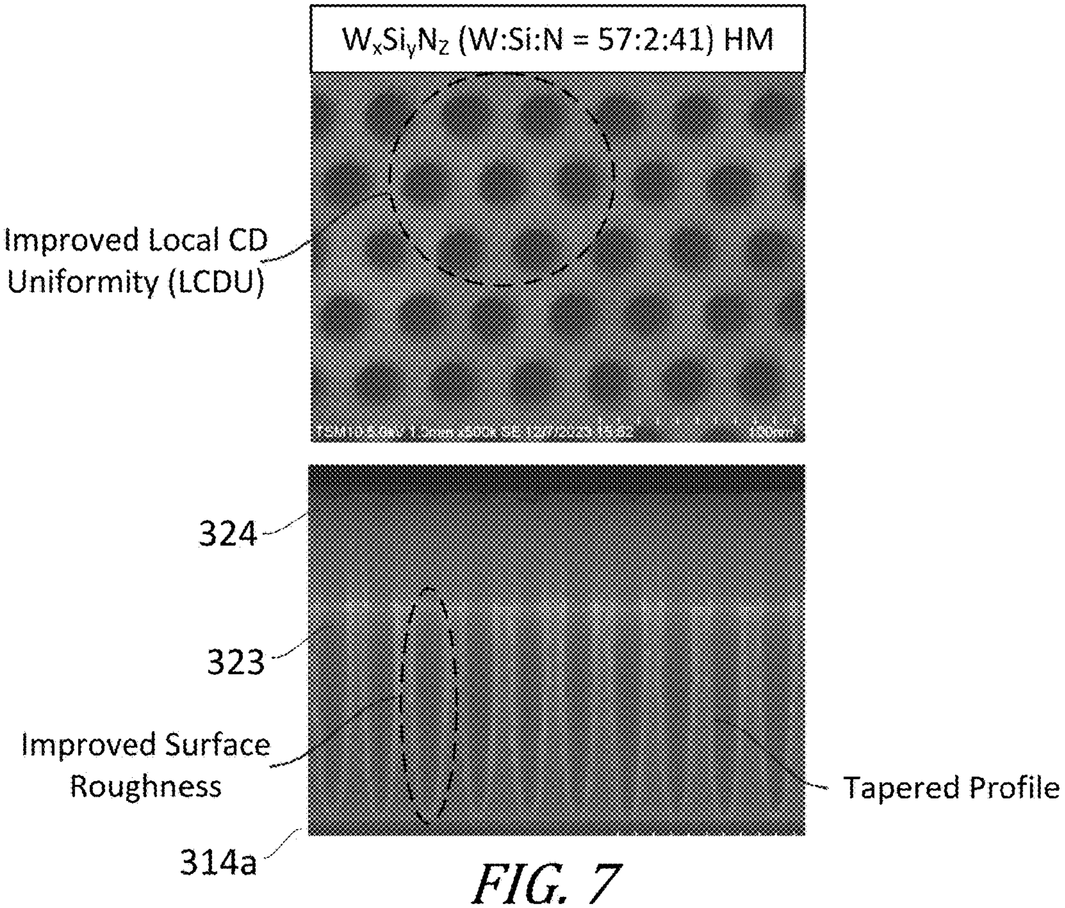
FIG. 7 are top-down and cross-sectional views of HAR features etched within a hard mask stack containing a metal silicide nitride (e.g., tungsten silicide nitride, $W_xSi_yN_z$) hard mask layer.

In a second experiment, a tungsten silicide nitride ($W_xSi_yN_z$) layer 323 having a uniform composition of 57 at. % tungsten (W), 2 at. % silicon (Si) and 41 at. % nitrogen (N) was deposited on the first etch stop layer 314*a* in place of the graduated hard mask layer 322 described above. FIGS. 6 and 7 illustrate results of an etch process used to etch a pattern of features 344 within a HM stack containing a 250 nm carbon-containing hard mask layer 326 (e.g., ACL, not shown), a 300 nm silicon-containing hard mask layer 324 (e.g., $SiO_2$), and a 300 nm $W_xSi_yN_z$ layer 323. As shown in the comparison between FIGS. 4-5 and FIGS. 6-7, decreasing the amount of Si and increasing the amount of N included within the hard mask layer improves the post-etch surface roughness and local CD uniformity of the features 344, but results in a tapered etch profile and poor etch selectivity to the underlying etch stop layer 314*a*.

Figure 8:
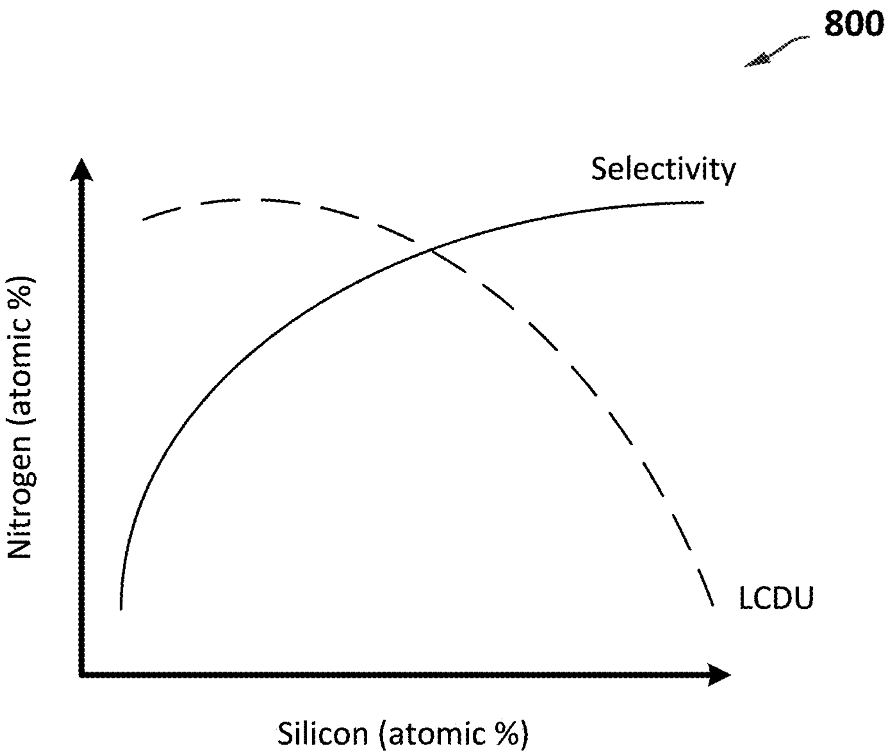
FIG. 8 is a graph illustrating the effect that varying the amount of silicon (Si) and nitrogen (N) included within the hard mask layer has on etch selectivity and local critical dimension (CD) uniformity (LCDU) during the Mask Open step.

The etch experiments shown in FIGS. 4-7 show that the amount of Si and N included within the tungsten silicide nitride ($W_xSi_yN_z$) layer affects the etch profile, post-etch surface roughness and local CD uniformity of the HAR features etched within the HM stack, as well as the selectivity of the etch process to the layer(s) underlying the HM stack. This concept is illustrated in the graph 800 shown in FIG. 8. As shown in the graph 800, the post-etch surface roughness and local CD uniformity (LCDU) of the HAR features improves when the amount of N (expressed as an atomic %) included within the $W_xSi_yN_z$ layer increases and the amount of Si (expressed as an atomic %) included within the $W_xSi_yN_z$ layer decreases. Conversely, etch profile and selectivity improves when the amount of Si included within the $W_xSi_yN_z$ layer increases and the amount of N included within the $W_xSi_yN_z$ layer decreases. Thus, improvements in etch profile, post-etch surface roughness, LCDU and etch selectivity can be achieved by changing the amount of Si and N included within the $W_xSi_yN_z$ layer across the thickness of the $W_xSi_yN_z$ layer.

Figure 9A:
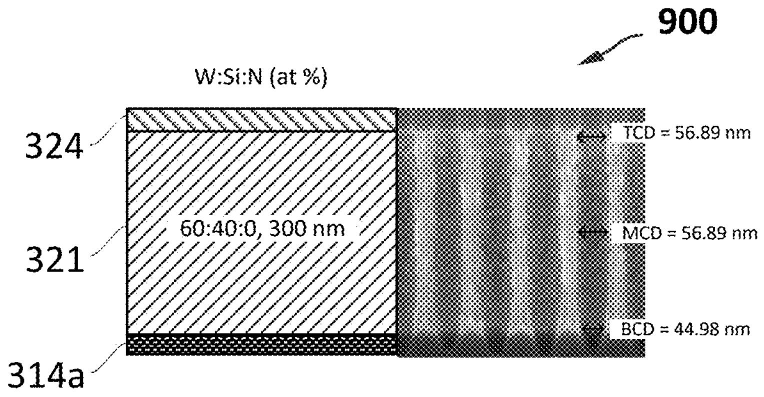
FIG. 9A illustrates etch results achieved when etching HAR features within a 300 nm tungsten silicide ($W_xSi_y$) hard mask layer having a uniform material composition.

Additional etch experiments were conducted to compare the etch results achieved when etching high aspect ratio features within hard mask layers of different material composition. FIG. 9A illustrates the results of a first etch experiment 900 performed to etch HAR features (e.g., holes) within a HM stack containing a 250 nm carbon-containing hard mask layer 326 (e.g., ACL, not shown), a 300 nm silicon-containing hard mask layer 324 (e.g., $SiO_2$), and a 300 nm $W_xSi_y$ hard mask layer 321 having a uniform composition of 60 at. % tungsten (W) and 40 at. % silicon (Si). As shown on the right side of FIG. 9A, the HAR features etched within the $W_xSi_y$ hard mask layer 321 have a substantially straight etch profile, as evidenced by the substantially consistent CD between the top and bottom of the HAR features. However, poor post-etch surface roughness and LCDU occurred during the first etch experiment 900 due to pitting of the $W_xSi_y$ hard mask sidewall surfaces.

Figure 9B:
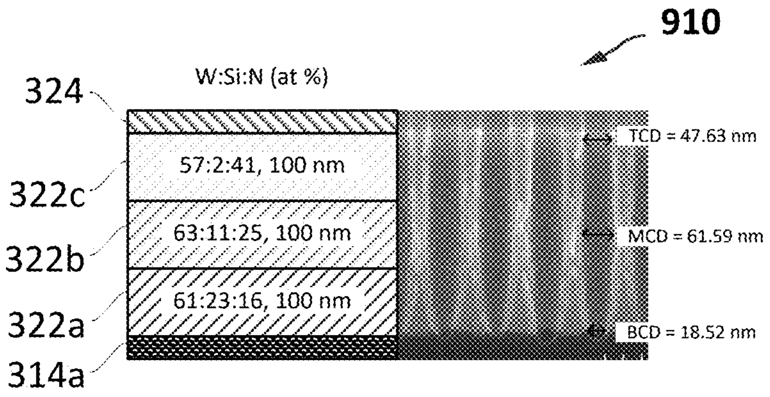
FIG. 9B illustrates etch results achieved when etching HAR features within a three-layer stack of tungsten silicide nitride ($W_xSi_yN_z$) hard mask layers, where each layer has a deposition thickness of 100 nm, but a different material composition.

FIG. 9B illustrates the results of a second etch experiment 910 performed to etch HAR features (e.g., holes) within a HM stack containing a 250 nm carbon-containing hard mask layer 326 (e.g., ACL, not shown), a 300 nm silicon-containing hard mask layer 324 (e.g., $SiO_2$), and a three-layer stack of $W_xSi_yN_z$ hard mask layers, each layer having a deposition thickness of 100 nm, but a different material composition. The three-layer stack included a first $W_xSi_yN_z$ hard mask layer 322*a* having a uniform composition of 61 at. % tungsten (W), 23 at. % silicon (Si) and 16 at. % nitrogen (N), a second $W_xSi_yN_z$ hard mask layer 322*b* having a uniform composition of 63 at. % tungsten (W), 11 at. % silicon (Si) and 25 at. % nitrogen (N), and a third $W_xSi_yN_z$ hard mask layer 322*c* having a uniform composition of 57 at. % tungsten (W), 2 at. % silicon (Si) and 41 at. % nitrogen (N). As shown on the right side of FIG. 9B, the HAR features etched within the three-layer stack of $W_xSi_yN_z$ hard mask layers 322*a*, 322*b*, 322*c* demonstrate improved post-etched surface roughness, compared to the HAR features shown in FIG. 9A, but suffer from bowing and tapering, as evidenced by the change in CD between the top and bottom of the HAR features.

Figure 9C:
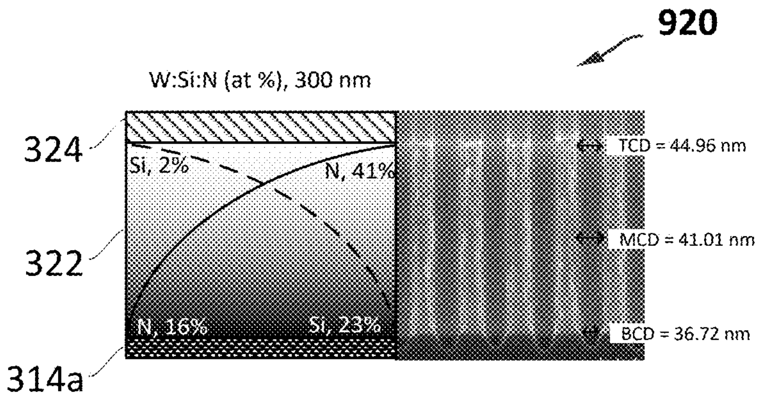
FIG. 9C illustrates etch results achieved when etching HAR features within a 300 nm tungsten silicide nitride ($W_xSi_yN_z$) hard mask layer having a material composition that varies gradually across the thickness of the $W_xSi_yN_z$ hard mask layer.

FIG. 9C illustrates the results of a third etch experiment 920 performed to etch HAR features (e.g., holes) within a HM stack containing a 250 nm carbon-containing hard mask layer 326 (e.g., ACL, not shown), a 300 nm silicon-containing hard mask layer 324 (e.g., $SiO_2$), and a 300 nm $W_xSi_yN_z$ hard mask layer having a material composition that varies gradually across the thickness of the $W_xSi_yN_z$ hard mask layer (i.e., a graduated hard mask layer 322). The graduated hard mask layer 322 used in the third etch experiment 920 contained a $W_xSi_yN_z$ material having a larger percentage of Si (23 at. %) and a smaller percentage of N (16 at. %) near the bottom of the graduated hard mask layer 322, which gradually transitions into a smaller atomic percentage of Si (2 at. %) and a larger percentage of N (41 at. %) near the top of the graduated hard mask layer 322. As shown on the right side of FIG. 9C, the HAR features etched within the graduated hard mask layer 322 demonstrate improved post-etched surface roughness and etch profile, compared to the HAR features shown in FIGS. 9A and 9B.

Stacked structures, process steps and methods for etching high aspect ratio features within hard mask layers are described herein in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Further modifications and alternative embodiments of the described stacked structures, process steps and methods will be apparent to those skilled in the art in view of this description. It will be recognized, therefore, that the described systems and methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method for etching high aspect ratio (HAR) features within a hard mask layer, the method comprising:

forming a graduated hard mask layer containing a metal silicide nitride material above and in contact with one or more underlying layers formed on a semiconductor substrate, wherein an amount of silicon and an amount of nitrogen included within the metal silicide nitride material varies across a thickness of the graduated hard mask layer; and performing a first etch process to etch the HAR features through the graduated hard mask layer, wherein the HAR features etched through the graduated hard mask layer have an aspect ratio greater than or equal to 30:1, and wherein the graduated hard mask layer improves an etch profile, a post-etch surface roughness and a critical dimension (CD) uniformity of the HAR features etched through the graduated hard mask layer, as well an etch selectivity to the one or more underlying layers, during the first etch process compared to an etch profile, a post-etch surface roughness, a CD uniformity, and an etch selectivity achieved with a hard mask layer having a uniform material composition that does not vary across a thickness of the hard mask layer.

2. The method of claim 1, wherein the thickness of the graduated hard mask layer ranges between 300 nm and 1000 nm.

3. The method of claim 1, wherein an atomic percentage of the silicon and an atomic percentage of the nitrogen included within the metal silicide nitride material changes gradually between a top and a bottom of the graduated hard mask layer.

4. The method of claim 3, wherein the atomic percentage of the silicon is smaller than the atomic percentage of the nitrogen near the top of the graduated hard mask layer to improve the post-etch surface roughness and the CD uniformity of the HAR features etched during the first etch process, and wherein the atomic percentage of the silicon is larger than the atomic percentage of the nitrogen near the bottom of the graduated hard mask layer to improve the etch profile of the HAR features and the etch selectivity to the one or more underlying layers during the first etch process.

5. The method of claim 3, wherein the atomic percentage of the silicon is larger than the atomic percentage of the nitrogen near the top of the graduated hard mask layer to improve an etch selectivity to other materials exposed on a surface of the semiconductor substrate, and wherein the atomic percentage of the silicon is smaller than the atomic percentage of the nitrogen near the bottom of the graduated hard mask layer to improve the post-etch surface roughness and the CD uniformity of the HAR features etched during the first etch process.

6. The method of claim 1, wherein said forming the graduated hard mask layer comprises:

depositing the metal silicide nitride material on the one or more underlying layers using a physical vapor deposition (PVD) process; and adjusting one or more process parameters during the PVD process to vary the amount of silicon and the amount of nitrogen included within the metal silicide nitride material as the metal silicide nitride material is deposited.

7. The method of claim 6, wherein said adjusting the one or more process parameters comprises continually or periodically adjusting one or more of a plasma power and a nitrogen ($N_2$) gas flow rate during the PVD process.

8. The method of claim 1, wherein the metal silicide nitride material is selected from a group consisting of a tungsten silicide nitride ($W_xSi_yN_z$) material, a titanium silicide nitride ($Ti_xSi_yN_z$) material, a cobalt silicide nitride ($Co_xSi_yN_z$) material, a nickel silicide nitride ($Ni_xSi_yN_z$) material, an aluminum silicide nitride ($Al_xSi_yN_z$) material, a molybdenum silicide nitride ($Mo_xSi_yN_z$) material, a tantalum silicide nitride ($Ta_xSi_yN_z$) material and a platinum silicide nitride ($Pt_xSi_yN_z$) material.

9. The method of claim 1, wherein the metal silicide nitride material is tungsten silicide nitride ($W_xSi_yN_z$).

10. A method for etching a pattern of holes within a stacked structure included within a semiconductor memory device, the method comprising:

forming the stacked structure on a semiconductor substrate, wherein said forming the stacked structure comprises:

forming one or more underlying layers on the semiconductor substrate; and forming a hard mask (HM) stack above and in contact with the one or more underlying layers, the HM stack comprising a graduated hard mask layer containing a metal silicide nitride material, wherein an amount of silicon and an amount of nitrogen included within the metal silicide nitride material varies across a thickness of the graduated hard mask layer;

performing a first etch process to etch the pattern of holes through the HM stack, wherein the pattern of holes etched through the HM stack have an aspect ratio greater than or equal to 30:1, wherein the graduated hard mask layer improves an etch profile, a post-etch surface roughness and a critical dimension (CD) uniformity of the pattern of holes etched through the HM stack, as well an etch selectivity to the one or more underlying layers, during the first etch process compared to an etch profile, a post-etch surface roughness, a CD uniformity, and an etch selectivity achieved with a hard mask layer having a uniform material composition that does not vary across a thickness of the hard mask layer; and performing one or more additional etch processes to etch the pattern of holes through the one or more underlying layers using the HM stack as a hard mask.

11. The method of claim 10, wherein said forming the HM stack further comprises:

forming a silicon-containing hard mask layer above and in contact with the graduated hard mask layer; and forming a carbon-containing hard mask layer above and in contact with the silicon-containing hard mask layer.

12. The method of claim 11, wherein the silicon-containing hard mask layer comprises a silicon dioxide ($SiO_2$) hard mask layer and the carbon-containing hard mask layer comprises an amorphous carbon layer (ACL) hard mask layer.

13. The method of claim 11, wherein the thickness of the HM stack ranges between 0.85 μm and 3.0 μm.

14. The method of claim 10, wherein the graduated hard mask layer contains a tungsten silicide nitride ($W_xSi_yN_z$) material.

15. The method of claim 14, wherein an atomic percentage of the silicon and an atomic percentage of the nitrogen included within the tungsten silicide nitride ($W_xSi_yN_z$) material changes gradually between a top and a bottom of the graduated hard mask layer.

16. The method of claim 15, wherein the atomic percentage of the silicon is smaller than the atomic percentage of the nitrogen near the top of the graduated hard mask layer to improve the post-etch surface roughness and the CD uniformity of the pattern of holes etched during the first etch process, and wherein the atomic percentage of the silicon is larger than the atomic percentage of the nitrogen near the bottom of the graduated hard mask layer to improve the etch profile of the pattern of holes and the etch selectivity to the one or more underlying layers during the first etch process.

17. The method of claim 16, wherein the semiconductor memory device is a dynamic random access memory (DRAM) device.

18. The method of claim 17, wherein said forming the one or more underlying layers on the semiconductor substrate comprises:

forming a capacitor mold oxide above the semiconductor substrate; and forming a first etch stop layer between the capacitor mold oxide and the graduated hard mask layer.

19. The method of claim 18, wherein the first etch stop layer comprises a silicon nitride (SiN) layer, and wherein the larger atomic percentage of the silicon near the bottom of the graduated hard mask layer improves the etch selectivity to the SiN layer during the first etch process.

20. The method of claim 18, wherein said performing the one or more additional etch processes comprises:

performing a second etch process to etch the pattern of holes through the first etch stop layer; and performing a third etch process to etch the pattern of holes through the capacitor mold oxide, wherein the pattern of holes are subsequently lined with a conductive material and filled with a dielectric material to form a plurality of capacitors for the DRAM device.

21. The method of claim 16, wherein the semiconductor memory device is a three dimensional (3D)-NAND Flash memory device.

22. The method of claim 21, wherein said forming the one or more underlying layers on the semiconductor substrate comprises forming a multilayer vertical stack of alternating layers of dielectric material and conductive material above the semiconductor substrate.

23. The method of claim 22, wherein said performing the one or more additional etch processes comprises:

performing a second etch process to etch the pattern of holes through the multilayer vertical stack to form contact holes, which are subsequently filled with a conductive material to connect individual memory cells of the 3D-NAND Flash memory device.

* * * * *